US006634455B1

(12) United States Patent
Yang

(10) Patent No.: US 6,634,455 B1
(45) Date of Patent: Oct. 21, 2003

(54) THIN-WALL MULTI-CONCENTRIC SLEEVE SPEAKER

(76) Inventor: Yi-Fu Yang, No. 40 Hwan Gone Rd., Yung Kang, Industrial Tainan County (TW)

( * ) Notice: Subject to any disclaimer, the term of this patent is extended or adjusted under 35 U.S.C. 154(b) by 0 days.

(21) Appl. No.: 09/226,545

(22) Filed: Jan. 6, 1999

Related U.S. Application Data

(63) Continuation-in-part of application No. 08/600,304, filed on Feb. 12, 1996, now Pat. No. 5,920,633.

(51) Int. Cl.[7] .................................................. H05K 5/00

(52) U.S. Cl. ........................ 181/156; 181/155; 381/341

(58) Field of Search ................................ 181/156, 148, 181/150, 153, 155; 381/341, 345, 338

(56) References Cited

U.S. PATENT DOCUMENTS 2,031,500 A 2/1936 Olney
2,765,864 A 10/1956 Glenn
2,825,419 A 3/1958 Stephens
2,852,087 A 9/1958 Ruschaupt
2,878,887 A 3/1959 Potter
2,917,127 A 12/1959 Elliott
2,926,740 A 3/1960 Holland
3,523,589 A 8/1970 Virva
3,687,220 A 8/1972 Virva
3,917,024 A 11/1975 Kaiser
3,923,124 A 12/1975 Hancock
4,213,008 A 7/1980 Helffrich
4,235,301 A 11/1980 Mitchell
4,298,087 A * 11/1981 Launay ....................... 181/153
4,373,606 A 2/1983 Clements et al.
4,593,784 A 6/1986 Flanders
4,628,528 A 12/1986 Bose et al.
4,760,601 A 7/1988 Pappanikolson
4,819,761 A 4/1989 Dick
4,837,837 A 6/1989 Taddeo
4,924,962 A 5/1990 Terai et al.
4,930,596 A 6/1990 Saiki et al.
4,942,939 A 7/1990 Harrison
5,170,435 A 12/1992 Rosen et al.
5,189,706 A * 2/1993 Saeki ......................... 181/155
5,197,103 A 3/1993 Hayakaw
5,721,401 A * 2/1998 Sim ........................... 181/148
6,144,751 A * 11/2000 Velandia ..................... 181/153

OTHER PUBLICATIONS

DeMichele, Glenn, Cylindrical Symmetric Guitar TLs Speaker Builder magazine, Jan. 1990, pp. 22–28.

* cited by examiner

*Primary Examiner*—Kimberly Lockett
(74) *Attorney, Agent, or Firm*—Keith A. Cushing

(57) ABSTRACT

An acoustic transmission line speaker enclosure with concentric cylindrical structures establishes acoustic coupling between a rear-traveling sound wave and a surrounding air mass. Inherent rigidity or high bending resistance of the cylindrical structure allows use of very thin walled cylinders without a massive and large overall enclosure. According to one aspect of the invention, an outer-most one of said cylinders includes wall structures adapted for coupling the rear-traveling sound wave therethrough to the surrounding air mass in phase with a forward-traveling sound wave from said speaker enclosure. An audio amplifier tunable to a listening room removes very low narrow frequency band components of an audio signal. Listening room cavity resonance is measured by injecting a frequency-varying sound wave into the listening room while detecting peak sound energy within the room. The filter the eliminates from the audio signal frequencies associated with listening room cavity resonance.

8 Claims, 9 Drawing Sheets

THIN-WALL MULTI-CONCENTRIC SLEEVE SPEAKER

RELATED APPLICATION

The present application is a continuation-in-part of prior U.S. patent application Ser. No. 08/600,304 filed Feb. 12, 1996 now U.S. Pat. No. 5,920,633.

BACKGROUND OF THE INVENTION

The present invention relates generally to sound reproduction equipment, and particularly to speaker enclosures including transmission line acoustic coupling and to audio reproduction equipment tuned relative to a specific listening environment.

Audio reproducing systems continue to evolve toward higher quality sound reproduction. Inherent non-linearity, i.e., variation in sound energy as a function of sound wavelength, continues to improve through research and development. From audio recording to audio reproduction, vast improvement in quality of equipment benefits the discriminating listener. Unfortunately, challenge remains in the context of distortion and frequency response for most audio equipment, especially at low frequency or bass wavelengths. Even highly advanced equipment suffers at extreme low frequencies in faithfully reproducing a linear sound presentation.

A high quality musical sound wave emerges from a loud speaker diaphragm coupled acoustically to a listening room, and a corresponding inverse-phase sound wave emerges from the rear of the speaker diaphragm. This rear-traveling sound wave, upon eventually being coupled to the surrounding air mass, introduces non-linearity in the otherwise high quality sound provided within the room by the front-traveling sound wave. Solutions have evolved, but not always proportionately for sound quality improvement in relation to expense.

A traditional cone diaphragm speaker pushes air forward out of the speaker enclosure in producing sound waves within a listening room. Sound waves emanating from the front and rear of the speaker diaphragm are complimentary, i.e., 180 degrees in phase relationship. Accordingly, coupling the forward traveling and rearward traveling sound waves within a common listening room can introduce non-linearity in sound presentation due to sound wave interference and cancellation. Ideally, such rear-traveling sound waves couple to a separate listening chamber, thereby avoiding sound wave interference and cancellation. For example, mounting speaker diaphragms within walls sends front-traveling waves to a first listening room and rear-traveling waves to a second listening room. Unfortunately, elaborate wall-mounted speaker systems are impractical for most listeners.

The traditional mechanism delivering sound presentation within a listening room is a speaker within an enclosure. The speaker diaphragm couples directly at its front surface to the listening room, and at its rear surface to the interior of the enclosure. Unfortunately, high quality sound reproduction requires venting or release of the rear-traveling sound waves, i.e., eventually the rear-traveling sound waves must exit the enclosure. The rear-traveling sound waves, upon emanating from the enclosure, preferably introduce little or no interference or sound wave cancellation relative to the front-traveling sound waves.

Acoustic transmission line speakers manage rear-traveling sound waves within a speaker enclosure.

Generally, a transmission line speaker enclosure provides acoustic coupling from the rear surface of the speaker diaphragm to the listening room along a transmission line or chamber of given length and cross sectional area. Acoustic transmission line length is a function of the wavelength of a particular sound frequency, e.g., speaker resonance. Cross sectional area corresponds to the effective surface area of the sound source, e.g., effective surface area of the speaker diaphragm.

A variety of acoustic transmission line speakers are known and commercially available. Unfortunately, due to the significant chamber length required in most acoustic transmission line speakers, i.e., those directed to management of very low frequency sound waves, acoustic transmission line speakers have evolved into large and massive structures. The acoustic transmission line can be "folded" or routed within the enclosure in a labyrinth to establish the required length within an overall box-like shape. Panels, typically wood, within the enclosure form the required acoustic transmission line or chamber with appropriate cross sectional area therealong. To resist deformation of the panels in response to sound pressure within the acoustic transmission line, such panels are of sufficient structural integrity, i.e., thickness, to maintain rigidity against sound wave pressure. The combination of thick panel structures forming the acoustic transmission line as a folded labyrinth within the speaker enclosure results in massive and large overall volume speaker enclosures.

It would be desirable to provide a transmission line speaker enclosure having an acoustic transmission line of appropriate length and cross section, but not requiring a large volume and massive speaker enclosure structure.

A reverberating sound wave, established by surrounding walls, floor, and ceiling, also brings interference relative to other sound waves within the listening room. This interference introduces non-linearity in the otherwise high quality sound provided at the loud speaker. Sound absorbent material in the listening room and elaborate tuning schemes attempt to minimize such non-linearity, but such methods and apparatus do not always proportionately improve sound quality in relation to the magnitude of expense required.

Cavity resonance in a listening room provides a significant source of reverberation interference degrading a high quality sound presentation. Room cavity resonance operates at a given fundamental frequency and associated harmonic frequencies. Across a range of typical room sizes, the fundamental resonate frequency falls in an audible frequency band. Due to cavity resonance, sound energy at the fundamental frequency does not dissipate as do other sound frequencies. Sound pressure, developed at the fundamental and harmonic frequencies, tends to build. The listener perceives a relatively louder sound at the resonant and harmonic frequencies. In other words, sound pressure tends to build excessively at the fundamental and harmonic frequencies within a given listening room and becomes, for the discriminating listener, an annoying departure from linear sound presentation.

Unfortunately, cavity resonance for a given listening room varies as a function of air density, room furnishings, or barometric conditions. Predicting narrow band cavity resonance in a given listening room becomes impossible. Cavity resonance can be as narrow as one hertz (Hz) in some listening rooms. Accordingly, an attempt to anticipate cavity resonance and filter such narrow fundamental frequency bands fails due to the narrow and unpredictable character of the fundamental and harmonic resonant frequencies.

SUMMARY OF THE INVENTION

An acoustic transmission line speaker enclosure according to one embodiment of the present invention includes a speaker driver mounting site defining front and rear directions. A first cylinder is positioned relative to the speaker mounting site to receive at a first end a rear-traveling sound wave and to emanate at a second end the rear-traveling sound wave. A second cylinder concentric to and relatively larger than the first cylinder surrounds the first cylinder. A cap at the second end of the second cylinder directs the rear-traveling sound wave from the first cylinder into a space between the first and second cylinders.

Additional cylinders may be added in concentric relation. Each cylinder radius creates an acoustic space between itself and a next-inner cylinder and having a cross sectional area equal to the cross sectional area of the central cylinder, the desired cross sectional area of the acoustic transmission line speaker. Cylinder lengths vary to establish a desired acoustic transmission line length.

More generally, a transmission line speaker enclosure under the present invention includes a plurality of sleeves arranged concentrically. A central one of the sleeves defines an associated acoustic space therein with a given cross sectional area. Each remaining sleeve defines an associated acoustic space between itself and a next smaller one of the sleeves. Each of the acoustic spaces are equal in cross sectional area to the given cross sectional area. Caps couple edges of alternating ones of the sleeves to establish, via the acoustic spaces, an acoustic transmission line within the enclosure.

According to a another aspect of the present invention, an audio reproduction system listening room tuning component receives an audio signal and provides a filtered audio signal. The tuning component includes a variable frequency sound source applicable to the listening room and including a frequency indicator. A sound input transducer measures and indicates sound energy within the listening room. A filter receives the audio signal and provides the filtered audio signal. The filter includes at least one control dictating a frequency band filtered and calibrated relative to the frequency indicator. By injecting a range of frequencies, including listening room cavity resonate frequencies, a peak value in sound energy indicates cavity resonate frequencies to be applied as control to the filter.

A method of tuning an audio system to a listening room under the present invention begins by detecting a cavity resonant frequency of the listening room and then adjusting a filter to the detected resonant frequency to filter an audio signal at the resonant frequency. Thereafter, the method applies the filtered audio signal to sound transducers within the room.

The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION OF THE PREFERRED EMBODIMENT.

Figure 1:
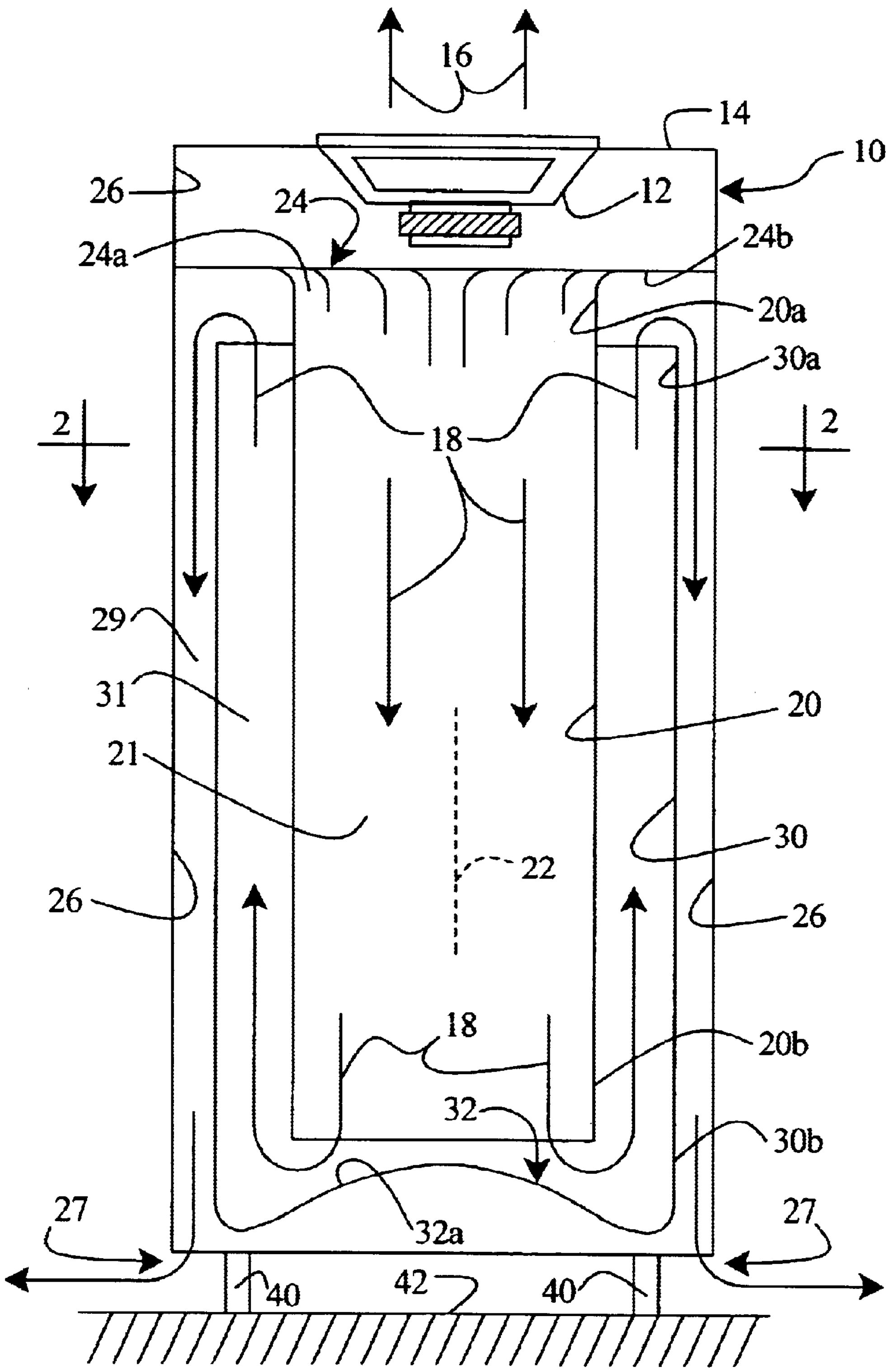
FIG. 1 illustrates schematically a multi-concentric transmission line speaker enclosure according to the present invention.

FIG. 1 illustrates schematically a three cylinder acoustic transmission line speaker enclosure 10. Externally, enclosure 10. presents a top wall 14, sidewalls 26, and a bottom opening 27. A speaker driver 12 mounts in top wall 14. Driver 12 emits a front sound wave 16, i.e., externally and upward relative to enclosure 10, and a rear sound wave 18. Rear sound wave 18 travels within enclosure 10 and eventually exits bottom opening 27. A central cylinder 20 rests concentrically relative to a central axis 22 of enclosure 10. An upper end 20*a* of central cylinder 20 opens as a flange 24 extending radially outward to sidewalls 26 of enclosure 10. The rear sound wave 18 enters a space 21 within central cylinder 20 through end 20*a* by way of upper surface 24*a* of flange 24. The lower end 20*b* of central cylinder 20 remains open.

A second cylinder 30, of radius larger than central cylinder 20, also lies concentric to central axis 22. Thus, central cylinder 20 lies generally within and concentric to second cylinder 30. Upper end 20*a* and flange 24 extend beyond upper end 30*a* of second cylinder 30 and toward driver 12. The perimeter of upper end 30*a* of cylinder 30 remains open. A cap 32 covers the lower end 30*b* of second cylinder 30, but at a given distance from the open lower end 20*b* of central cylinder 20. As rear sound wave 18 travels downward within space 21 of cylinder 20 and out lower end 20*a*, sound wave 18 eventually encounters the inner surface 32 a of cap 32. Cap 32 directs sound wave 18 from within inner cylinder 20 to space 31 of second cylinder 30. In particular, cap 32 directs sound wave 18 into and upward along space 31 between inner cylinder 20 and outer cylinder 30. As illustrated in FIG. 1, the inner surface 32*a* includes a convex central portion and concave peripheral portion. Such contouring may be refined mathematically according to a desired guide path for sound wave 18 from central cylinder 20 into second cylinder 30. In addition, cap 32 must be spaced appropriately from end 20*b* of cylinder 30 to maintain the desired cross sectional area in transition from space 21 to space 31.

Sound wave 18 then travels within space 31 upward along the perimeter of cylinder 30 and eventually reaches the upper end 30*a* of cylinder 30. Outer sidewalls 26 may be formed as a cylinder also concentric to axis 22. Under the particular embodiment illustrated herein the outer structure employed is not a cylinder, but does provide a space 29 between the exterior of second cylinder 30 and sidewalls 26. The assembly of central cylinder 20 and second cylinder 30 rests concentrically within enclosure 10, i.e., centered within sidewalls 26 of enclosure 10. Under the particular embodiment illustrated herein, sidewalls 26 define in cross section a "demi-square" shape as described more fully hereafter.

In either case, sidewalls 26 define a space 29 between the exterior surface of second cylinder 30 and the inner surface of sidewalls 26. Space 29 is open to the listening room via bottom opening 27 of enclosure 10. As sound wave 18 travels past upper end 30*a* of second cylinder 30, sound wave 18 encounters the undersurface 24*b* of flange 24. Undersurface 24*b* redirects sound wave 18 downward along the inner surface of sidewalls 26, i.e., in space 29 between second cylinder 30 and sidewalls 26. Sound wave 18 eventually emerges from the bottom opening 27 of enclosure 10. Legs 40 couple to sidewalls 26 and provide clearance between bottom opening 27 and a floor 42 upon which enclosure 10 rests.

Figure 2:
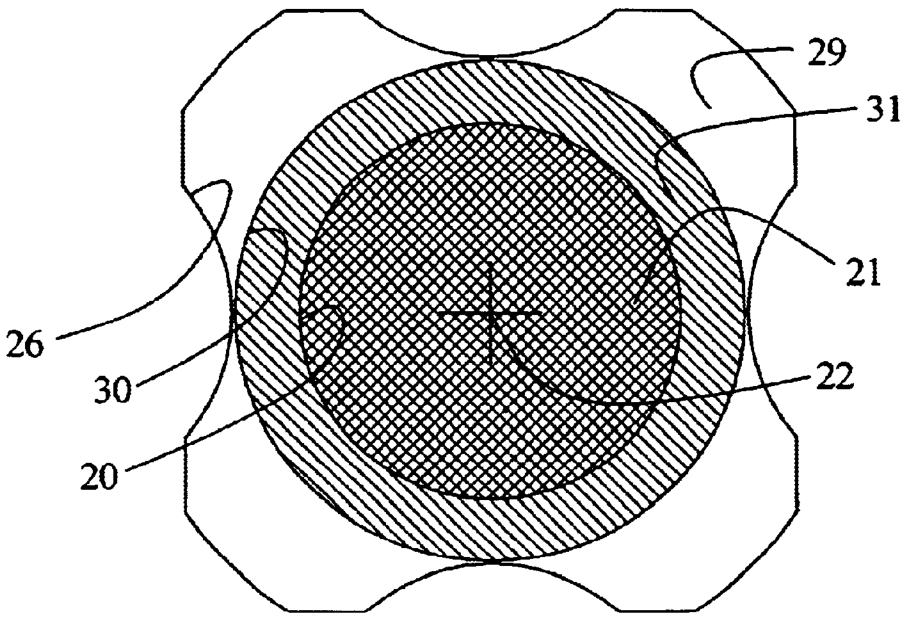
FIG. 2 illustrates cross sectional areas of the acoustic transmission line provided by the enclosure of FIG. 1 as taken along lines 2—2 of FIG. 1.

FIG. 2 illustrates in cross section the spaces 21, 31, and 29 within enclosure 10 and providing uniform acoustic transmission line cross sectional area. The cross section of space 21 is circular and corresponds to the effective displacement area for speaker driver 12. The cross sectional area for space 31, i.e., between cylinder 20 and cylinder 30, is annular and equal to the cross sectional area of space 21. Space 29 has a cross sectional area also equal to that of spaces 21 and 31. While an annular cross section for space 29 would result from use of a cylinder in forming sidewalls 26, this particular embodiment of the present invention employs a structure having a "demi-square" shape.

Figure 3:
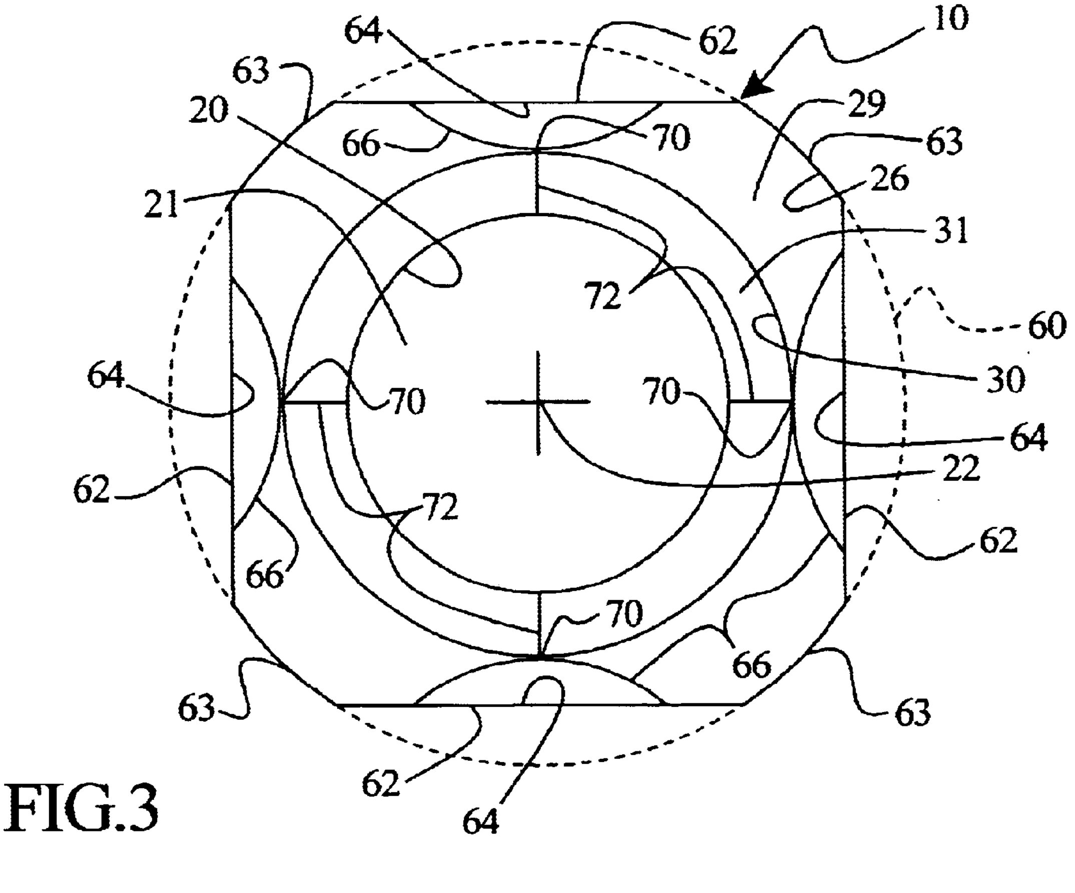
FIG. 3 illustrates a sectional view of the enclosure of FIG. 1, as taken along lines 2—2.

FIG. 3 illustrates schematically the structure of enclosure 10 as taken along lines 2—2 of FIG. 2, but detailing the "demi-square" shape provided by sidewalls 26. In FIG. 3, the "demi-square" cross sectional shape for exterior walls 26 begins with a cylinder 60. Cylinder 60 is made "demi-square" by taking four sectors 62, each parallel to central axis 22. Each sector thereby defines a flat panel wall 64 coupled to remaining adjacent portions 63 of cylinder 60. At the interior surface of each flat panel wall 64, a curved plate 66, having sufficient bending resistance, attaches. In this manner, the curved plates 66 introduce sufficient bending resistance for the otherwise planar walls 64. Also indicated in FIG. 3, curved plates 66 attach to the exterior of cylinder 30 at support points 70 to aid in support for the assembly of cylinders 20 and 30. Further, support arms 72 couple the exterior surface of cylinder 20 and the interior surface of cylinder 30 to further aid in structural support and rigidity.

Thus, enclosure 10 provides an acoustic transmission line coupling back sound wave 18 to the air chamber external of enclosure 10. The following formula calculates an acoustic transmission line length (L) as function of sound wave length (λ):

$$L = \frac{\lambda}{4} \qquad 1$$

The required minimum length of the acoustic transmission line for enclosure 10 should be calculated at a lowest frequency of audio sound to be reproduced by speaker driver 12. For example, to minimize distortion relative to a 30 Hz sound wave 18, the minimum length of the transmission line is L=2.886 meters or 112.8 inches. As may be appreciated, the multi-concentric cylinder architecture of enclosure 10 supports simple modification in acoustic transmission line length by simply varying the length of the various cylindrical structures.

In addition to length, an acoustic transmission line must provide along each portion of its path a cross sectional area equal to the sound wave carried therein, i.e., substantially equal to the cross sectional area of speaker driver 12. Speaker driver manufacturers typically provide as a specification the effective area of displacement provided by a given speaker driver. By appropriately selecting the radius of each cylindrical structure, a uniform cross sectional area results The cross-sectional area of the interior of central cylinder 20 corresponds to the displacement area of speaker driver 12, designated Al herein. The following formula calculates a radius for the inner surface of central cylinder 20 relative to axis central 22:

$$\sqrt{\frac{Al}{\pi}} \qquad 2$$

Central cylinder 20 wall thickness, i.e., difference between inner surface and outer surface radii relative to central axis 22, takes into account material used and a desired high bending resistance. Such thickness varies across design and cost of manufacture criteria, but under the present invention is generally minimized due to the inherent high bending resistance provided by a cylindric body such as central cylinder 20. More particularly, the high bending resistance of the cylinder structure as used in multi concentric cylindric transmission line speaker enclosure under the present invention allows very thin cylinder walls.

A woofer speaker can range from six to twelve inches in diameter. For such speakers, wall thickness for cylinders 20 and 30 may be as little as 0.5 to 1.5 mm thickness of aluminum material. Such structure, though extremely thin, is strong enough to resist deformation due to vibration induced by the impact of sound pressure therein. A similar result, i.e., very thin wall thickness, may be obtained by use of plastic materials.

Use of aluminum and plastics in forming a multi-concentric acoustic transmission line simplifies manufacture relative to use of alternative, and traditional, material such as wood. Furthermore, aluminum and plastic materials can be constructed from recycled materials as an environmental and ecologically friendly feature of the present invention. For example, an aluminum cylinder may be compared to a woodpanel-formed duct. For an inside diameter of 300 mm and wall thickness of 0.5 mm, an aluminum cylinder deforms radially approximately 0.14 mm in response to two atmospheres of pressure within. A woodpanel-formed duct having the same interior cross-section, e.g., a 266 mm square interior, requires a wall thickness of approximately 12 mm to sustain a 0.18 mm displacement in response to two atmospheres pressure within. Thus, for approximately the same resistance to deformation in response to air pressure, the cylindric structure allows significantly thinner walls, i.e., a woodpanel-formed duct has walls approximately 24 times thicker than that of the aluminum cylinder.

An outside radius for cylinder 20, i.e., inner radius plus cylinder 20 wall thickness, may be designated R1 and the inner radius of second cylinder 30 calculated as follows:

$$\sqrt{\frac{R1^2 + A1}{\pi}} \tag{3}$$

Second cylinder 30 wall thickness establishes a desired bending resistance taking into account material used. Second cylinder 30 outer radius may be designated R2 and the inner radius for a next concentric cylinder calculated as follows:

$$\sqrt{\frac{R2^2 + A1}{\pi}} \tag{4}$$

Any number of additional cylinders are added with appropriate inner radius relative to the outer radius of the preceding cylinder to maintain in the space therebetween a cross-sectional area equal to the effective surface area of the speaker driver 12. An appropriate number of cylinders and cylinder lengths establishes a desired acoustic transmission line length within a speaker enclosure.

Use of cap 32 and flange 24 in directing a sound wave from one cylinder to a next must maintain the desired cross sectional area. Accordingly, the specific dimension and shape of such structures, e.g., cap 32 and flange 24, may be designed to maintain such cross sectional area in the travel path provided for sound wave 18.

Figure 4:
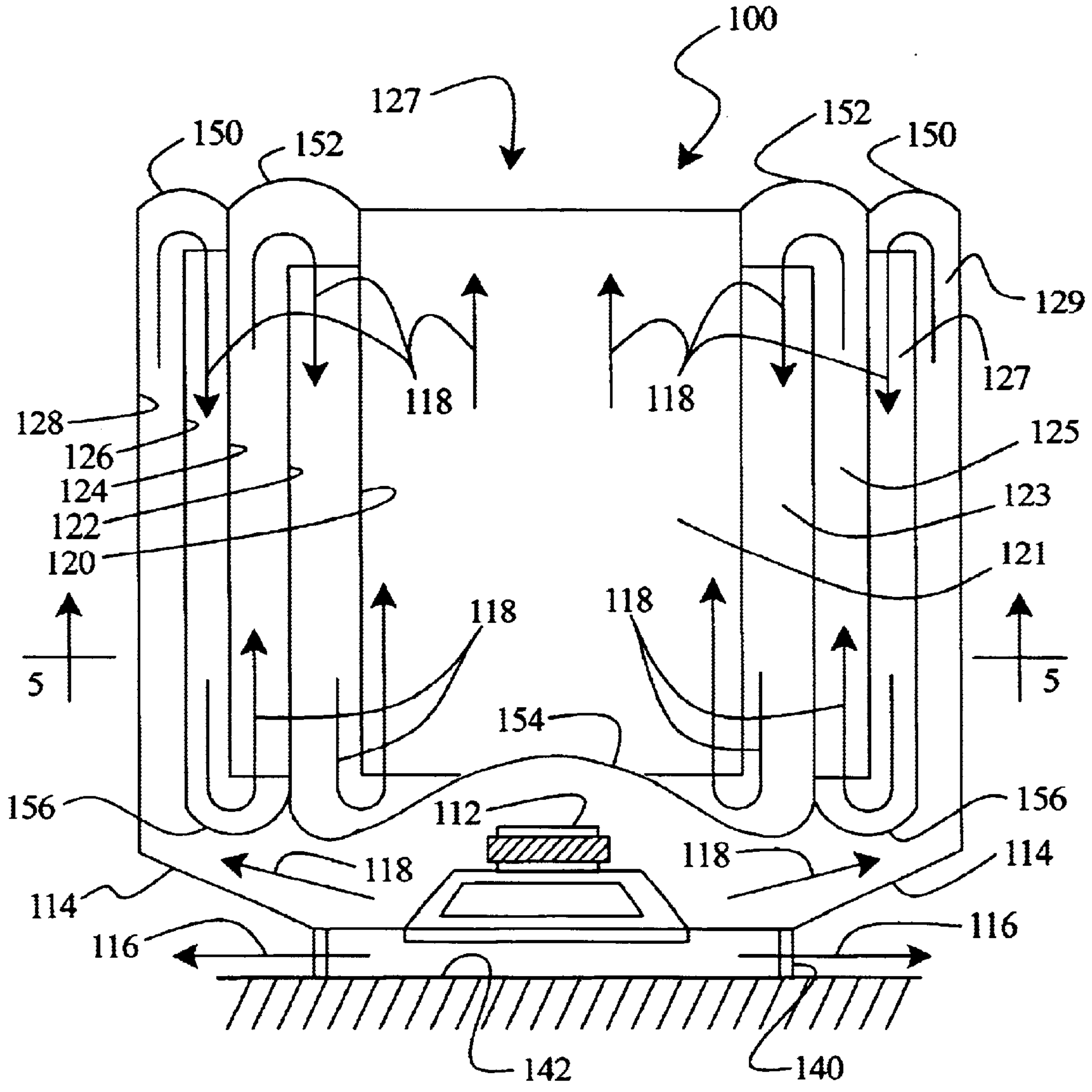
FIG. 4 illustrates a second embodiment of a multi-concentric transmission line speaker in accordance with the present invention.

FIG. 4 illustrates schematically a second embodiment of the present invention including concentric cylinders interconnected to form an acoustic transmission line speaker enclosure 100. In FIG. 4, enclosure 100 includes a basin 114 supported in spaced relation from a floor 142 by means of legs 140. Basin 114 serves as a mounting site for speaker driver 112. A front-traveling sound wave 116 emanates from speaker driver 112 and passes between basin 114 and floor 142. Enclosure 100 includes a central top opening 127. Speaker driver 112 produces a rear-traveling sound wave 118. Sound wave 118 travels within enclosure 100 and eventually exits enclosure 100 at top central opening 127, i.e., travels from outer cylinders toward a central cylinder defining opening 127.

Figure 5:
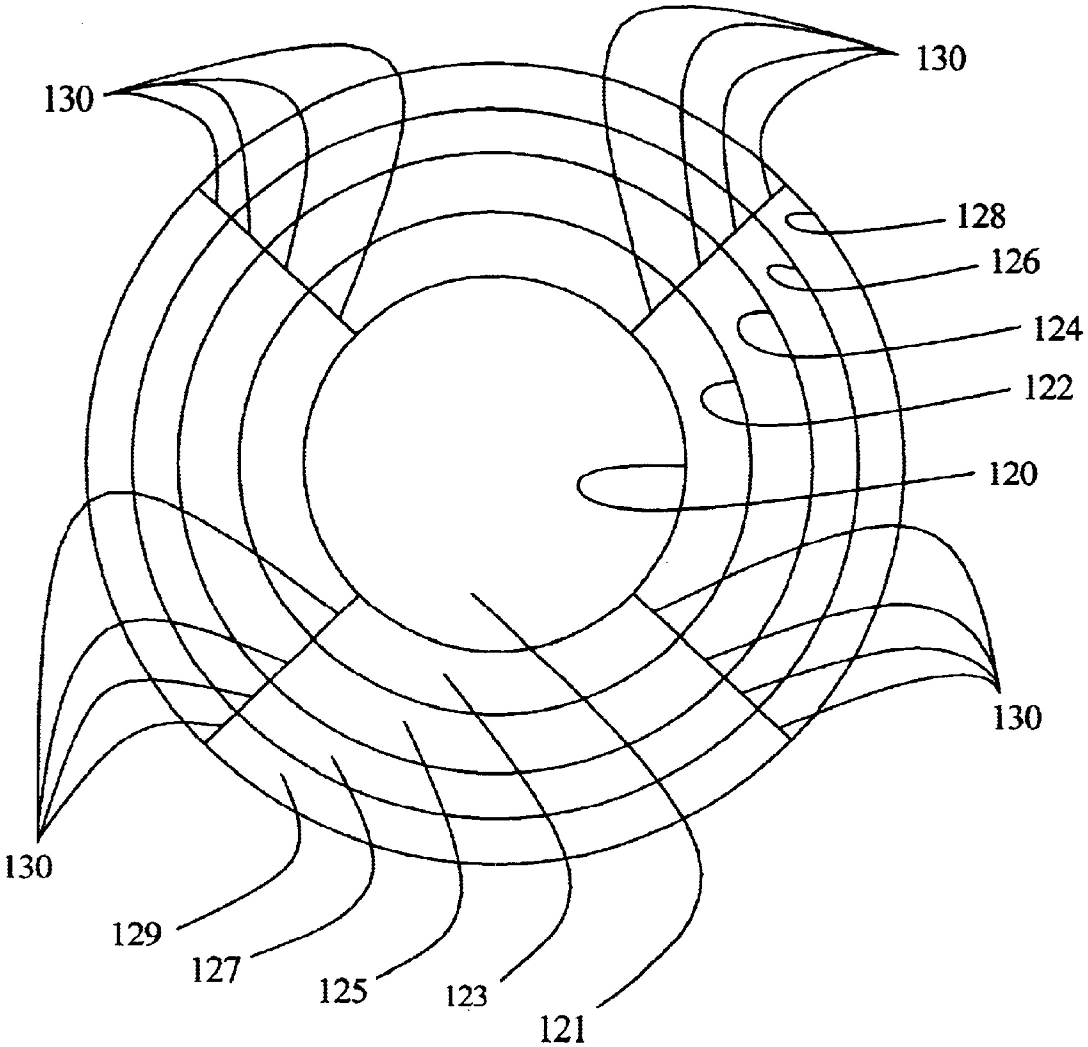
FIG. 5 illustrates a cross sectional view of the speaker enclosure of FIG. 4 as taken along lines 5—5 of FIG. 4.

A central cylinder 120 rests directly above speaker driver 112 and defines at its upper end the top central opening 127. A second cylinder 122 of larger radius relative to cylinder 120 rests concentrically relative to cylinder 120. A third cylinder 124 larger in radius than cylinder 122 rests concentrically relative to cylinders 120 and 122. A fourth cylinder 126 larger in diameter relative to cylinder 124 rests concentrically relative to cylinders 120, 122, and 124. An exterior sidewall cylinder 128 of larger radius than cylinder 126 rests concentrically relative to cylinders 126, 124, 122, and 120. Exterior sidewall cylinder 128 couples directly to and is supported directly at its lower edges by basin 114. The assembly of concentric cylinders 120, 122, 124, 126, and 128 are maintained in fixed relationship by means of interconnecting support elements 130, best seen in FIG. 5.

The interior of cylinder 120 defines a space 121. The interior of cylinder 122 outside cylinder 120 defines a space 123. The interior of cylinder 124 outside cylinder 122 defines a space 125. The interior of cylinder 128 outside cylinder 126 defines a space 129. Cylinders 120, 124, and 128 extend above cylinders 122 and 126.

An annular cap 150 spans the upper edges of cylinders 126 and 128. Similarly, annular cap 152 spans the upper edges of cylinders 120 and 124. As explained more fully hereafter, cap 150 directs sound wave 118 from space 127 into space 129. Similarly, cap 152 directs sound wave 118 from space 125 into space 123. A cap 154, including a convex central portion and concave peripheral portion, closes the lower end of cylinder 122. The concave-convex contour of the inside surface of cap 154 directs sound wave 118 from space 123 into space 121. As may be appreciated, cap 154 must be spaced sufficient distance from cylinder 120 to maintain a desired cross sectional area for the sound wave 118 travel path. An annular cap 156 spans the bottom edges of cylinders 126 and 122, thereby directing sound wave 118 from space 127 into space 125.

In operation, sound wave 118, being blocked by caps 154 and 156, travels outward along basin 114, into space 129, and upward along the periphery of cylinder 126. As sound wave 118 reaches the top of cylinder 126, cap 150 guides sound wave 118 downward into space 127. Sound wave 118 then travels downward along the periphery of cylinder 126 until it encounters cap 156. Cap 156 redirects sound wave 118 into space 125 and sound wave 118 travels upward along the periphery of cylinder 124. Eventually, sound wave 118 travels upward and reaches cap 152 which redirects sound wave 118 downward into space 123. Sound wave 118 then travels downward along the periphery of cylinder 122 until it encounters cap 154 which directs sound wave 118 into space 121 of cylinder 120. Sound wave 118 then travels upward and exits enclosure 100 at the top central opening 127.

As discussed herein above, the length of transmission line provided in enclosure 100 may be adjusted to meet a particular wave length by manipulation of the overall length dimension of cylinders 120, 122, 124, 126 and 128 in combination with spacing relative to caps 150, 152, 154, and 156. Relative spacing between the caps 150, 152, 154, and 156 and the associated cylinders 120, 122, 124, 126, and 128 must take into account a desired cross sectional area to be maintained along the acoustic transmission line provided by enclosure 100. Also, the relative size, i.e., radius, of cylinders 120, 122, 124, 126, and 128 is calculated as described above to maintain an equal magnitude cross sectional area for the spaces 121, 123, 125, 127, and 129.

Figure 6:
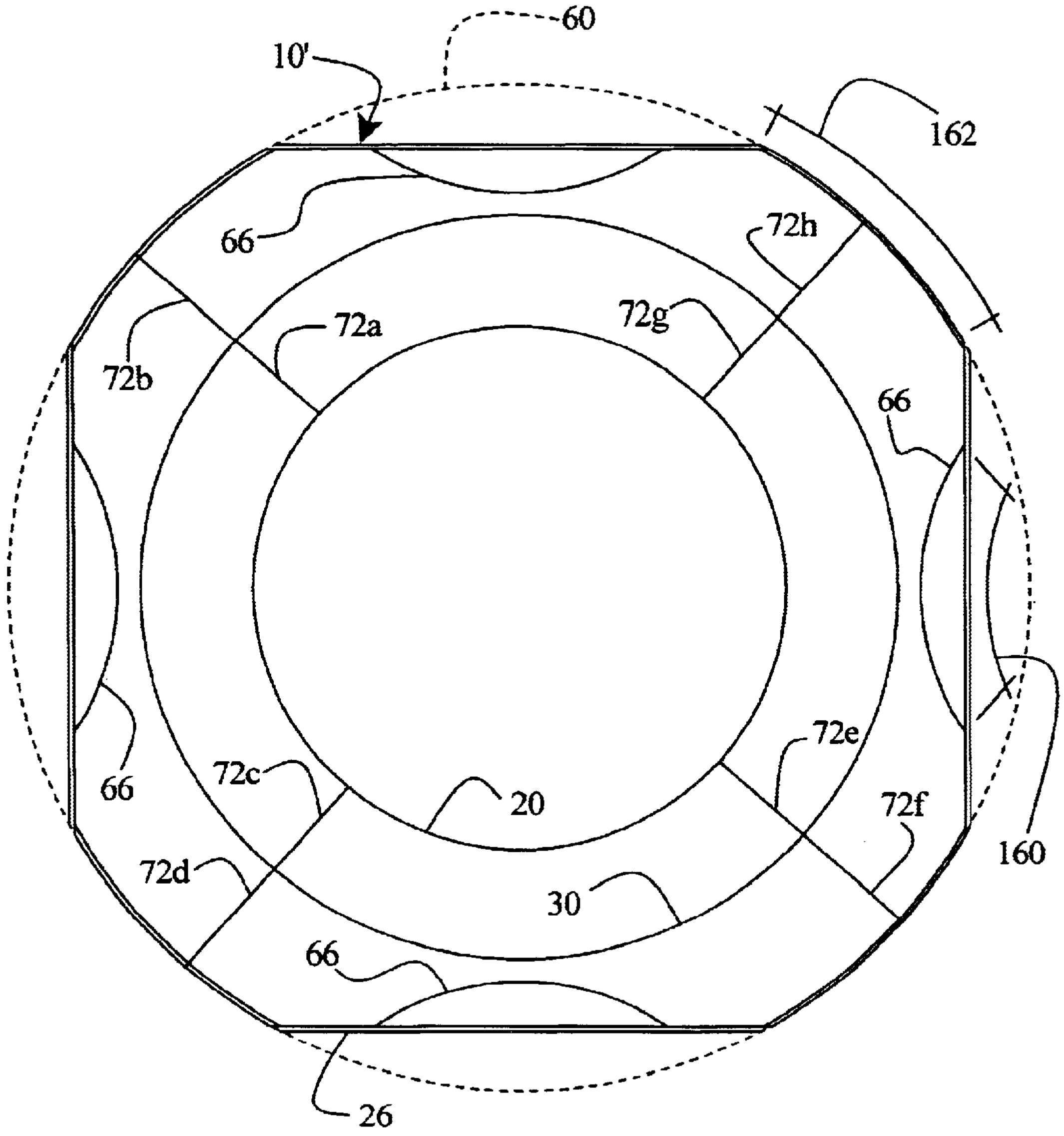
FIG. 6 illustrates further structural details of the speaker enclosure of FIG. 1.

FIG. 6 illustrates in more detail the structure of a speaker enclosure according to the embodiment of FIGS. 1–3. In FIG. 6, speaker enclosure 10' is illustrated in cross section, similar to the cross-sectional view of FIG. 3. Enclosure 10' receives an 8 inch speaker (not shown in FIG. 6). Enclosure 10' assumes the "demi-square" shape discussed earlier. Width, both vertical and horizontal in the view of FIG. 6, is 280 mm. The height of enclosure 10' is dictated by the selected transmission line length, i.e., a function of a specific wave length optimally coupled to the surrounding air mass. Exterior sidewalls 26, having the above-described "demi-square" cross-sectional shape, are 1.5 mm thick. Interior wall structures, i.e., cylinder 20 and cylinder 30 are only 0.5 mm thick. Cylinder 20 has an 87.50 mm radius and cylinder 30 has a 125.00 mm radius. Cylinder 60, forming the basis for the "demi-square" shape of sidewalls 26 has a 165.00 mm radius. Curved plates 66 have a thickness of 1.5 mm and extend through their curved portion along an arc 160 of 51.39 degrees with a radius of 116.00 mm. The rounded corners of enclosure 10', i.e., the remaining portions of cylinder 60, extend through an arc 162 of 26.09 degrees.

Enclosure 10' also includes support arms 72 extending radially outward at 4 equi-angularly distributed locations.

More particularly, support arm 72*a* couples cylinder 20 and cylinder 30 while support arm 72*b* couples cylinder 30 and one of the rounded corners of sidewall 26. Similarly, support arms 72*c* and 72*d* extend radially outward toward a next rounded corner of enclosure 10' with support arm 72*c* coupling cylinder 20 and cylinder 30 and support arm 72*d* coupling cylinder 30 and sidewall 26. Support arms 72*e* and 72*f* are similarly located relative to a third one of the rounded corners of enclosure 10'. Finally, support arms 72*g* and 72*h* extend radially outward in similar fashion to the last one of the rounded corners of enclosure 10.

Figure 7:
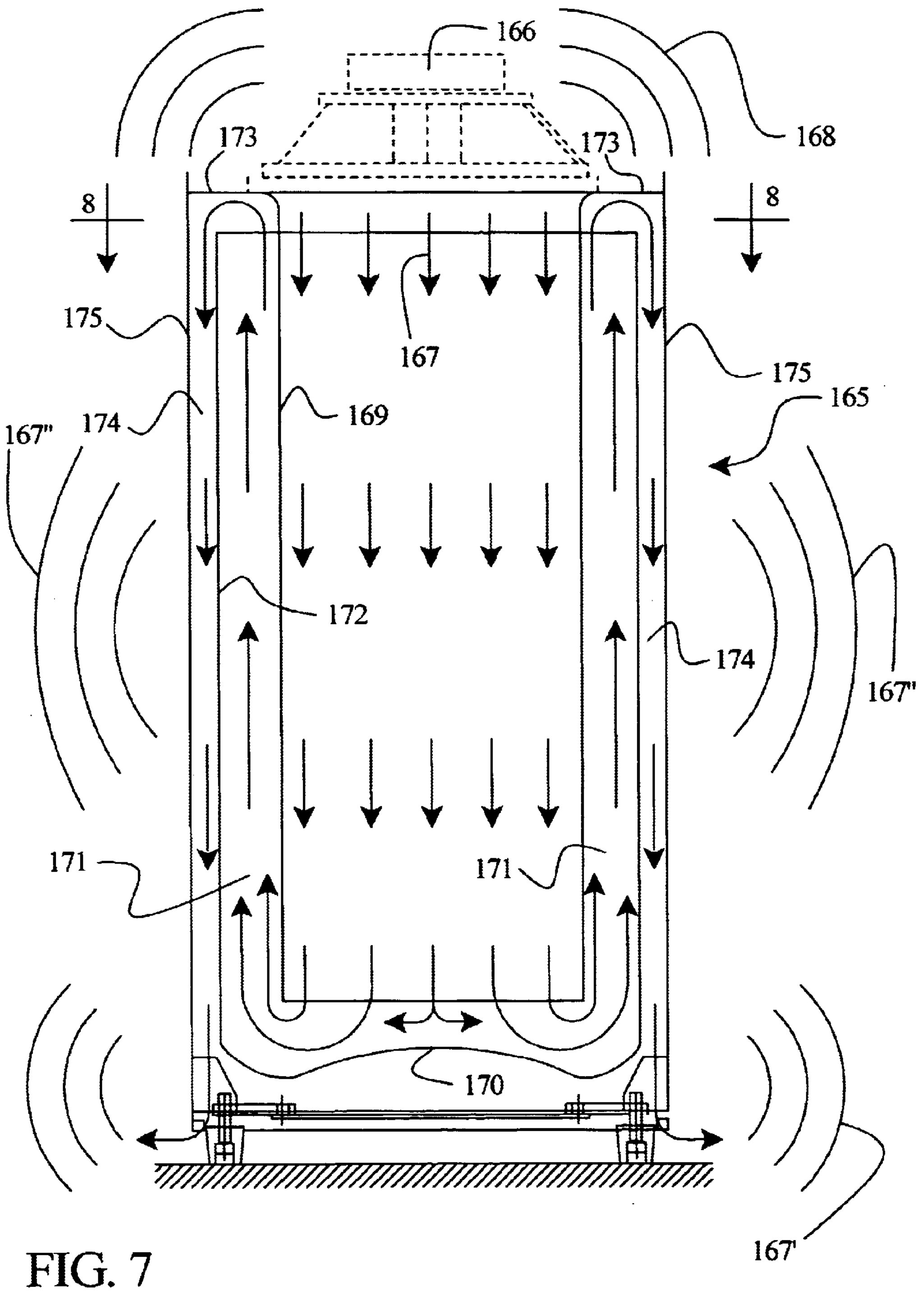
FIG. 7 illustrates a third embodiment of a multi-concentric transmission line speaker in accordance with the present invention.
Figure 8:
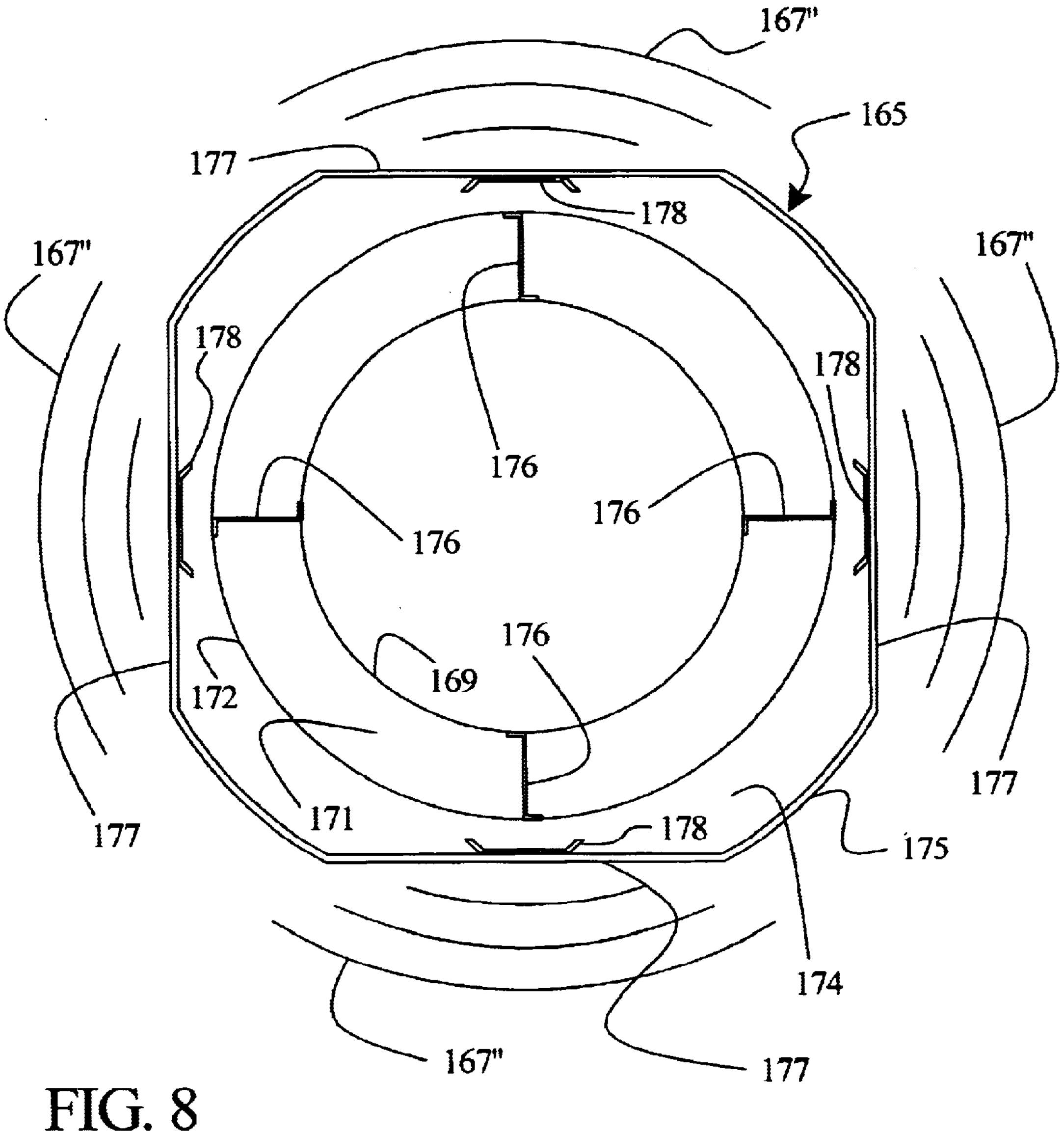
FIG. 8 illustrates a cross-sectional view of the speaker enclosure of FIG. 7 as taken along lines 8—8 of FIG. 7.
Figure 9:
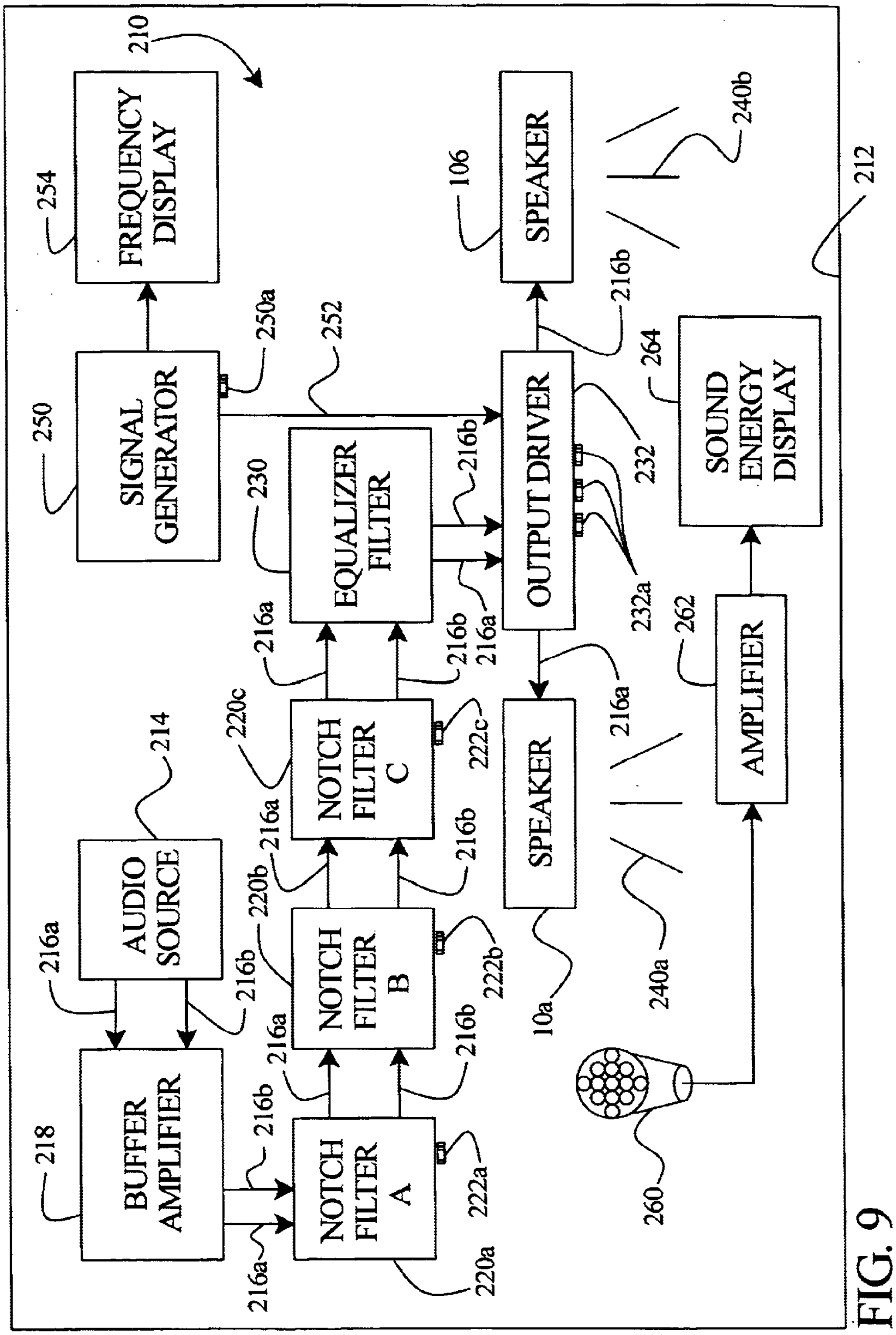
FIG. 9 illustrates an analog audio amplifier according to a first embodiment of the present invention tunable to a given listening room.
Figure 10:
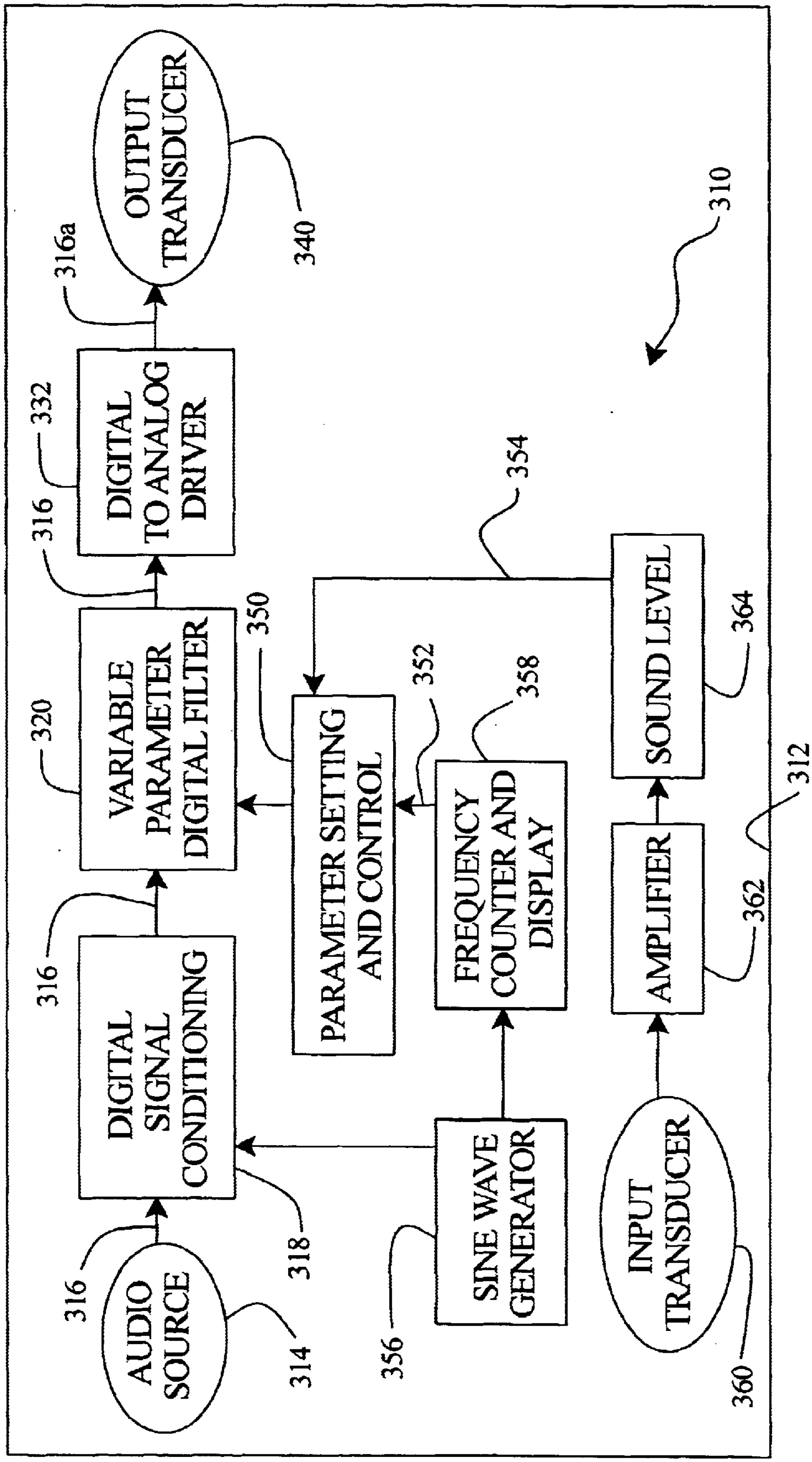
FIG. 10 illustrates a digital audio amplifier according to a second embodiment of the present invention tunable to a given listening room.

FIGS. 7 and 8 illustrate a speaker enclosure 165 according to a further embodiment of the present invention. As with previous embodiments, a speaker driver 166 produces forward traveling and rearward traveling sound waves, i.e., a forward traveling sound wave 167 and a rearward traveling sound wave 168. In the particular embodiment illustrated in FIGS. 7 and 8, speaker driver 166 mounts to the top of enclosure 165 and the forward traveling sound wave 167 travels downward into the central cylinder 169. The rearward traveling sound wave 168 couples directly to the surrounding air mass. Sound waves 168 and 167 emerge from speaker driver 166 in 180 degree phase relation.

Sound wave 167 travels down to the lower opening of central cylinder 169 and encounters cap 170. Cap 170 deflects sound wave 167 upward into a space 171 between the exterior of cylinder 169 and the interior of cylinder 172. Cap 170 closes the lower end of cylinder 172. Sound wave 167 then travels upward to the upper open end of cylinder 172. An annular cap 173 surrounds speaker driver 166 and deflects sound wave 167 downward. Sound wave 167 thereby enters a space 174 between cylinder 172 and outer sleeve 175. As sound wave 167 travels downward through space 174 it eventually emerges from enclosure 165 at the lower open end of sleeve 175.

As in previous embodiments of the present invention, the selected relative spacing between cylinders 169 and 172 and sleeve 175 as well as the selected relative length of the structures establishes a desired transmission line length and appropriate cross sectional area in relation to the speaker driver 166. Also as in previous embodiments of the present invention, use of cylindrical structures, i.e., cylinders 169 and 172 provide inherent structural rigidity and resistance to deformation due to sound pressure whereby a thin-walled structure and overall light-weight structure results.

With reference to FIG. 8, cylinder 169 couples rigidly to cylinder 172 by way of support arms 176. Thus, as sound wave 167 emerges from driver 166 and travels through the interior of cylinder 169 and along space 171 between cylinders 169 and 172, no significant coupling of sound energy occurs other than propagation of the sound wave 167 through the air mass therealong. In other words, due to the inherent structural rigidity and resistance to deformation of cylinders 169 and 172, the sound pressure present within cylinder 169 and space 171 does not interfere laterally with other aspects of sound wave 167. Thus, cylinders 169 and 172 serve as "sound-barriers" relative to lateral coupling of sound energy through enclosure 165.

In accordance with this aspect of the present invention, however, planar portions or walls 177 of the exterior walls of enclosure 165 as provided by the demi-square sleeve 175 acoustically couple laterally to the surrounding air mass. In previous embodiments, e.g., as in FIG. 6, the external demi-square sleeve couples by means of curved plates 66 to the intermediate cylinder 30. This mechanical coupling improves the structural rigidity of the planar portions of the demi-square sleeve 26. However, under the aspect of the present invention shown in FIGS. 7 and 8, the planar portions or walls 177 of the demi-square sleeves 175 intentionally are not directly coupled to the next-inward cylinder 172 and thereby react to sound pressure within space 174. In other words, the planar side walls 177 of demi-square sleeve 175 act as sound transducers between space 174 and the surrounding air mass. Accordingly, enclosure 165 has three sound wave output locations. First, the rearward traveling sound wave 168 couples directly to the surrounding air mass. Second, the sound wave 167 as provided at the lower opening of sleeve 175 emerges as sound wave 167'. Third, a sound wave 167" emerges laterally from the planar side walls 177 of demi-square sleeve 175.

Thus, deflection allowed in the outer planar walls 177 in response to sound pressure within space 174 establishes a sound transducer coupling sound energy in space 174 laterally through walls 177 into the surrounding air mass. This provides a substantially large coupling area for a sound wave passing through walls 177. Furthermore, sound waves 167" emerging from walls 177 are generally in synchronization with the sound waves 167', i.e., substantially according to the selected transmission line and desired sound wave delay established thereby. The planar surfaces of the side walls 177 in effect provide a large area sound transducer inducing an "in-phase" sound wave 167" to the surrounding air mass. Thus, sound waves 168, 167', and 167" all occur substantially in-phase. This particular design, i.e., including sound transmitting side wall enclosures, establishes very low frequency sound reproduction, e.g., on the order of 30 Hz, and, to the discriminating listener, appreciably improves sound reproduction. With a moderate sized speaker driver 166 a generally compact and light weight overall speaker enclosure results but with very low bass sound in sufficient intensity, and without significant distortion, to faithfully reproduce sound energy at very low frequencies.

Brackets 178 may be attached to the inner surfaces of walls 177 and, in conjunction with a selected material and thickness for walls 177, establish a desired vibrational characteristic for laterally coupling sound from space 174 to the exterior of enclosure 165, i.e., for producing sound waves 167".

Thus, improved acoustic transmission line speaker enclosures have been shown and described. The multi-concentric cylindrical architecture supports simple design strategy to establish a desired length and cross sectional specification; and does not limit the position of the speaker driver, number of cylinders required, or the orientation of sound emanation. The present invention provides a light weight, space saving speaker enclosure using recyclable material. Movement of the rear-traveling sound wave can be arranged either from the outer cylinder towards the central cylinder or from the central cylinder toward the outer cylinder.

While illustrated herein as cylinders, other sleeve-like structures may be used. For example, a sleeve structure having a "demi-square" cross sectional shape.

The speaker enclosures illustrated herein possess an ability to produce extremely low frequency sound waves. Conventional speakers typically cannot reproduce such low frequency sound waves. Accordingly, use of such multi-concentric cylinder speaker enclosures introduces a new range of audio reproduction, i.e., an ability to produce very low bass frequencies. While production of such low frequency sound waves is a desirable feature for the discriminating listener, such very low frequency sound waves can establish a resonant effect within a listening room. In other words, the speaker enclosures illustrated herein faithfully reproduce sound waves at sufficiently low frequencies to match the cavity resonance frequency for a typical listening room.

FIG. 7 illustrates in block diagram an audio reproduction system 210 located within a given listening room or cavity 212. As may be appreciated, room or cavity 212 possesses a given cavity resonance including a fundamental frequency and associated harmonic frequencies. System 210 includes an audio source 214 presenting right and left audio channels 216*a* and 216*b* to a buffer amplifier 218. Buffer 218 amplifies audio channels 216 and presents channels 216 to a series combination of variable frequency notch filters 220, designated individually herein as filters 220*a*, 220*b*, and 220*c*. Notch filters 220 are, for example, variable or tunable notch filters each with a narrow frequency band and high ratio of rejection characteristics. For example, at approximately 30 Hz each filter 220 provides a "notch" or filtering band from 1 to 1.5 Hz wide. Each filter 220 includes three variable resistor trims synchronized to become a variable notch filter tunable to a very narrow frequency band.

Each of notch filters 220 receives channels 216*a* and 216*b*, filters a very narrow and low frequency wavelength therein, and provides as output channels 216*a* and 216*b* to a next successive component. Notch filter 220*a* receives channels 216*a* and 216*b* from buffer amplifier 218 and passes channels 216*a* and 216*b* to notch filter 220*b*. Notch filter 220*b* passes channels 21*a* and 216*b* to notch filter 220*c*, and notch filter 220*c* passes channels 216*a* and 216*b* to an equalizer filter 230. Each of notch filters 220*a*–220*c* include a corresponding control 222*a*–222*c*, respectively, dictating the wavelength filtered from channels 216*a* and 216*b*.

Equalizer filter 230 is a conventional equalizer filter providing modification in a plurality of relatively broad frequency bands. Equalizer filter 230 passes channels 216*a* and 216*b* to an output driver 232. Output driver 232 provides channel 216*a* to a speaker enclosure 10*a*, illustrated schematically in FIG. 7, and channel 216*b* to a speaker enclosure 10*b*, also illustrated schematically. Enclosures 10*a* and 10*b* correspond to the above-described multi-concentric cylinder acoustic transmission line speaker enclosures. Each speaker enclosure 10*a* and 10*b* includes a speaker producing a sound wave 240*a* and 240*b*, respectively, within cavity 212. As discussed herein-above, speaker enclosures 10*a* and 10*b* faithfully reproduce very low frequency sound waves, low enough to establish a resonance effect within cavity 212. Output driver 232 includes a plurality of controls 232*a* according to conventional audio control features, e.g., tone, balance, and volume.

Sound waves 240 enter cavity 212 and provide the desired sound presentation according to audio source 214. Due to cavity 212 resonance, however, certain portions of sound waves 240 tend to build and present a relatively higher volume perception relative to an intended presentation of audio source 214. In particular, certain very low frequency sound waves tend to build within cavity 212.

Thus, system 210 operates generally in the fashion of a conventional audio reproduction system, but incorporates a series of very narrow frequency band notch filters whereby selected narrow low frequency bands in channels 216*a* and 216*b* are eliminated by manipulation of controls 222.

In accordance with the present invention, system 210 further includes a 20 Hz to 20 kHz sine wave signal generator 250 providing a sine wave input 252 to output driver 232. Signal generator 250 includes a control 250*a* dictating the frequency of signal 252. A frequency display

254 coupled to signal generator 250 provides a visual indication of the frequency of signal 252. Thus, by manipulation of control 250*a*, a user of system 250 injects into cavity 212 sound waves 240 at a given frequency.

System 210 further includes a transducer or microphone 260 coupled to an amplifier 262. Amplifier 262 drives a sound energy display 264. By monitoring sound energy display 264 while manipulating control 250*a*, the user determines cavity 212 resonance. More particularly, as the user moves control 250*a*, a range of sound wave 240 frequencies appear in cavity 212. When a frequency coincident with the cavity 212 fundamental frequency enters cavity 212, a relatively greater magnitude sound energy exists within room 212. Accordingly, at such fundamental frequency, sound energy display 264 reaches a maximum value. In this manner, a user of system 210 determines the current fundamental cavity resonance for room 212.

Once control 250*a* is adjusted to develop sound waves 240 at the fundamental frequency, the user observes frequency display 254. Frequency display 254 then represents the fundamental frequency for cavity 212. The user then adjusts one of notch filters 220, i.e., adjusts a control 222, to correspond to the frequency display 254 presentation. As may be appreciated, calibration provided on control 250 and controls 222 may be coordinated in such manner to allow a user to match a control 222 setting based on a control 250*a* setting. Alternatively, controls 222 may be calibrated relative to information presentation at frequency display 254. In any case, one of notch filters 220 is adjusted to a given frequency band setting based on the frequency of sine wave injected into cavity 212 and providing a relatively greater magnitude sound energy therein. In this manner, the user eliminates a narrow frequency band originating from audio source 214.

Further frequency bands, i.e., harmonic frequencies, may also introduce undesirable non-linearity in sound presentation. Such harmonic frequencies may also be detected by further manipulation of control 250*a* and observation of sound energy display 264. If the user observes additional peak frequencies, i.e., peak values indicated at sound energy display 264, several of notch filters 220 are used to filter corresponding narrow frequency bands. As may be appreciated, more or fewer than three notch filters 220 may be used in a given embodiment of the present invention.

Frequency suppression, i.e., filtering by notch filters 220, would typically by under 250 Hz. In frequencies above 250 Hz, the reverberating interference band is much wider and equalizer filter 230 can be used to smooth any such broad band interference frequencies. The traditional equalizer filter, however, cannot appropriately eliminate cavity resonance due to the extremely low, narrow frequency bands associated with cavity resonance.

FIG. 8 illustrates a second embodiment of the present invention, a digital system 310 providing a more automated method of tuning to a given cavity 312 resonance. In FIG. 8, a digital audio source 314 provides digital audio signal 316, including right and left stereo channels, to a digital signal conditioning block 318. Digital signal conditioning block 318 drives a variable parameter digital filter 320. As may be appreciated, digital filter responds to parameters applied to establish a selected one or more frequency filter functions. Digital filter 320 output drives a digital-to-analog converter and driver 332. Driver 132 provides an amplified analog version of signal 116, designated 316*a*, to output transducers 340, i.e., to multi-concentric cylinder speaker enclosures as described herein-above and receiving right and left channels of signal 316*a*.

As described thus far, system 310 operates generally under conventional digital audio reproduction, but incorporates a variable parameter digital filter 320 in series between digital signal conditioning block 318 and driver 332.

A parameter setting and control block 350 dictates operation of digital filter 320. Parameter setting control block 350 receives a frequency signal 352 and a sound level signal 354. Frequency signal 352 originates from a sine wave generator 356 and arrives via a frequency counter and read out block 358. Further, sine wave generator 356 output applies to digital signal conditioning block 318 as an alternate audio source. In this manner, system 310 injects a sound wave within cavity 312 at a selected frequency.

An input transducer, i.e., microphone, 360 monitors sound waves within cavity 312 and drives an amplifier 362. Amplifier 362 drives a sound level block 364. Sound level block 364 delivers the sound energy signal 354 to parameter setting and control block 350. Microphone 360 may be positioned at a selected point, i.e., an optimum listening point, within room 312 to establish ideal listening conditions at such selected listening point.

System 310 is initialized relative to a given cavity resonance, i.e., to a given set of conditions for room 312, by first injecting a slowly varying frequency sine wave signal into cavity 312. Transducer 360 receives the sound wave and provides, via amplifier 362, representation thereof to sound level block 364. Parameter setting and control block 350 monitors signal 354, representing the magnitude of detected sound energy within room 312, and detects a peak magnitude in signal 354.

Parameter setting and control block 350 associates a given frequency in frequency signal 352 with a peak magnitude indication in signal 354, thereby detecting cavity resonance for room 312. Parameter setting and control block 350 then establishes within digital filter 320 a frequency parameter corresponding to the detected room 312 cavity resonance. Such process may be repeated to detect additional peak magnitude sound level readings in room 312 and associated frequency values. In this manner, one or more frequency parameters are applied to digital filter 320 to remove from signal 316 narrow frequency bands associated with cavity 312 resonance.

Following initialization, system 310 operates digital audio source 314 in normal fashion, but removes at variable parameter digital filter 320 the detected narrow frequency bands associated with room 312 cavity resonance. Audio reproduction system 310 is thereby tuned to a specific cavity resonance for room 312. As may be appreciated, such tuning may also be invoke manually, by a user following a change of conditions within cavity 312.

Thus, an improved audio reproduction system has been shown and described including ability to tune to a specific cavity resonance. Under the present invention, improved speaker enclosures can produce very low frequency sound waves in very narrow low frequency bands associated with cavity resonance. Such frequencies are filtered from an audio signal prior to presentation at the improved speaker enclosures. In this manner, the audio signal is "predampened" at frequencies corresponding to cavity resonance frequencies thereby eliminating sound-build up within the cavity as a function of cavity resonance. The discriminating listener thereby enjoys a more faithful, i.e., more linear, reproduction of sound presentation as intended in the original recording.

It will be appreciated that the present invention is not restricted to the particular embodiment that has been described and illustrated, and that variations may be made therein without departing from the scope of the invention as found in the appended claims and equivalents thereof.

What is claimed is:

1. An acoustic transmission line speaker enclosure comprising:

a speaker driver mounting site defining front and rear directions;

a first cylinder positioned relative to said speaker mounting site to receive at a first end a rear-traveling sound wave and to emanate at a second end said rear-traveling sound wave;

a second cylinder concentric to and relatively larger than said first cylinder, an inner radius of said second cylinder being selected relative to an outer radius of said first cylinder to establish a space between said first and second cylinders of cross-sectional area substantially equal to an inner cross-sectional area of said first cylinder, a first end of said second cylinder being adjacent said first end of said first cylinder and a second end of said second cylinder being adjacent said second end of said first cylinder;

a cap at said second end of said second cylinder directing said rear-traveling sound wave from said first cylinder into said space between said first and second cylinders while maintaining therealong a cross-sectional area substantially equal to that of said space;

a sleeve surrounding said second cylinder, said sleeve including a first end adjacent said first end of said second cylinder and a second end adjacent said second end of said second cylinder; and a guide coupling said first end of said first cylinder and said first end of said sleeve and being spaced from the first end of said second cylinder whereby said guide directs said rear-traveling sound wave out of said second cylinder and into a space between said second cylinder and said sleeve, said sleeve including outer walls adapted for vibration in response to sound energy between said sleeve and said second cylinder and thereby coupling sound energy therethrough.

2. An acoustic transmission line speaker enclosure according to claim 1 wherein said sleeve defines a demi-square shape in cross section, said sleeve including planar wall portions.

3. An acoustic transmission line speaker enclosure according to claim 1 wherein a cross sectional area of a space between said second cylinder and said sleeve corresponds to a cross sectional area of said first cylinder.

4. An acoustic transmission line speaker enclosure according to claim 1 further comprising an opening acoustically coupled to said first end of said second cylinder.

5. A transmission line speaker enclosure comprising:

a plurality of sleeves arranged concentrically, a central one of said sleeves defining an associated acoustic space therein and having a given cross sectional area, each remaining sleeve defining an associated acoustic space between itself and a next smaller one of said sleeves, each of said acoustic spaces being substantially equal in cross sectional area to said given cross sectional area;

caps coupling edges of alternating ones of said sleeves to establish via said acoustic spaces an acoustic transmission line within said enclosure; and an outer-most one of said sleeves including wall portions adapted for vibration in response to sound energy within said outer-most sleeve and thereby coupling sound energy therethrough.

6. An acoustic transmission line speaker enclosure according to claim 5 wherein said acoustic transmission line comprises acoustic space of said central one of said sleeves acoustically to an outer-most acoustic space associated with said outer-most one of said sleeves.

7. An acoustic transmission line speaker enclosure according to claim 5 wherein said acoustic space of said central sleeve first receives a rear-traveling sound wave of a speaker driver when mounted to said enclosure.

8. An acoustic transmission line speaker including a plurality of concentric sleeve structures defining a continuous air space beginning with the interior of an inner-most one of said sleeves and continuing serially through said plurality of sleeves in spaces therebetween;

a driver coupled to said interior space of said inner-most sleeve; and said outer-most sleeve including planar wall portions adapted for vibrating in response to sound energy therein and thereby coupling sound energy therethrough.

* * * * *